(12) United States Patent
Shinyashiki

(10) Patent No.: US 12,267,969 B2
(45) Date of Patent: Apr. 1, 2025

(54) DISPLAY APPARATUS

(71) Applicant: DENSO TEN Limited, Kobe (JP)

(72) Inventor: Akira Shinyashiki, Kobe (JP)

(73) Assignee: DENSO TEN Limited, Kobe (JP)

( * ) Notice: Subject to any disclaimer, the term of this patent is extended or adjusted under 35 U.S.C. 154(b) by 205 days.

(21) Appl. No.: 18/144,910

(22) Filed: May 9, 2023

(65) Prior Publication Data
US 2024/0081004 A1 Mar. 7, 2024

(30) Foreign Application Priority Data

Sep. 1, 2022 (JP) ................................. 2022-139461

(51) Int. Cl.
*H05K 5/02* (2006.01)

(52) U.S. Cl.
CPC ................................. *H05K 5/0217* (2013.01)

(58) Field of Classification Search
CPC ............... H05K 5/0217; G06F 1/1656; G02F 1/133308; B60K 35/00; B60K 35/22; B60K 35/28; B60K 35/60; B60K 2360/166; B60K 2360/691; B60K 2360/771; B60K 2360/652; B60K 2360/816; B60K 35/50
See application file for complete search history.

(56) References Cited

U.S. PATENT DOCUMENTS

| | | | | |
|---|---|---|---|---|
| 7,118,265 B2 * | 10/2006 | Cho | .................. | G02F 1/133308 362/606 |
| 8,736,783 B2 * | 5/2014 | Lo | ......................... | G06F 1/1637 349/58 |
| 9,072,167 B2 * | 6/2015 | Gu | ....................... | H05K 5/0017 |
| 9,952,621 B2 * | 4/2018 | Jeong | ..................... | H04N 5/645 |
| 10,178,783 B2 * | 1/2019 | Yonemaru | ............ | H05K 5/0017 |
| 2006/0103774 A1 * | 5/2006 | Han | .................. | G02F 1/133385 349/58 |
| 2008/0068530 A1 * | 3/2008 | Lee | ................... | G02F 1/133608 349/58 |
| 2015/0002780 A1 * | 1/2015 | Lu | ..................... | G02F 1/133308 349/60 |
| 2016/0150658 A1 * | 5/2016 | Tsukahara | ............ | H05K 5/0217 361/679.01 |
| 2019/0129235 A1 * | 5/2019 | Yamamoto | ........ | G02F 1/133308 |
| 2022/0177042 A1 * | 6/2022 | Yonezawa | .............. | B60K 35/00 |
| 2023/0112001 A1 * | 4/2023 | Ikumi | .................. | B60K 35/213 361/679.01 |

FOREIGN PATENT DOCUMENTS

JP 2001-96325 A 4/2001

* cited by examiner

*Primary Examiner* — Sagar Shrestha

(74) *Attorney, Agent, or Firm* — Oliff PLC

(57) ABSTRACT

A housing that houses a display panel includes a first wall and a second wall. A protrusion is formed on the first wall. A through hole is formed in the second wall. The protrusion passes through the through hole. A tip of the protrusion that has been passed through the through hole is expanded to fasten the first wall to the second wall. A clearance between the protrusion and the through hole is divided into a first part and a second part. The first and second parts are unequally allocated so that when a force from a front side to a back side of the display panel is applied to the first wall/second wall, the first wall/second wall is suppressed from being displaced relative to the second wall/first wall.

12 Claims, 10 Drawing Sheets

DISPLAY APPARATUS

BACKGROUND OF THE INVENTION

Field of the Invention

The invention relates to a display apparatus.

Description of the Background Art

Conventionally, various technologies relating to a display apparatus including a display panel have been proposed. Furthermore, for example, various technologies relating to a housing (case) that houses parts, such as a display panel, have been also proposed (for example, refer to Japanese Published Unexamined Patent Application No. 2001-096325).

SUMMARY OF THE INVENTION

According to one aspect of the invention, a display apparatus includes: a display panel; and a housing that houses at least a part of an outer periphery of the display panel so as to surround the display panel from a back side of the display panel. The housing includes: a back surface that is located adjacent to the back side of the display panel; a first wall that extends from a first side of the back surface toward a front side of the display panel so as to surround a first part of the outer periphery of the display panel; a second wall that extends from a second side of the back surface toward the front side of the display panel so as to surround a second part of the outer periphery of the display panel, the second side of the back surface being adjacent to the first side of the back surface; a protrusion that is formed on a portion of an end of the first wall that overlaps with an end of the second wall; and a through hole that is formed in the end of the second wall, the protrusion passing through the through hole. A tip of the protrusion that has been passed through the through hole is expanded to fasten the first wall to the second wall, and a clearance that is formed between an outer circumferential surface of the protrusion and an inner circumferential surface of the through hole is divided into a first part and a second part. The first part which is adjacent to a side of the protrusion that faces toward the back surface of the housing is smaller than the second part which is adjacent to a side of the protrusion that faces away from the back surface of the housing. Thus, when a force from the front side to the back side of the display panel is applied to the first wall, the first wall is suppressed from being displaced relative to the second wall.

It is an object of the invention to provide a display apparatus capable of securing an appropriate strength against a force when the force is applied to the display panel.

These and other objects, features, aspects and advantages of the invention will become more apparent from the following detailed description of the invention when taken in conjunction with the accompanying drawings.

DESCRIPTION OF THE EMBODIMENTS

A display apparatus according to an embodiment will be described below in detail with reference to the accompanying drawings. In addition, this invention is not limited to the embodiment described below.

Embodiment

Figure 1:
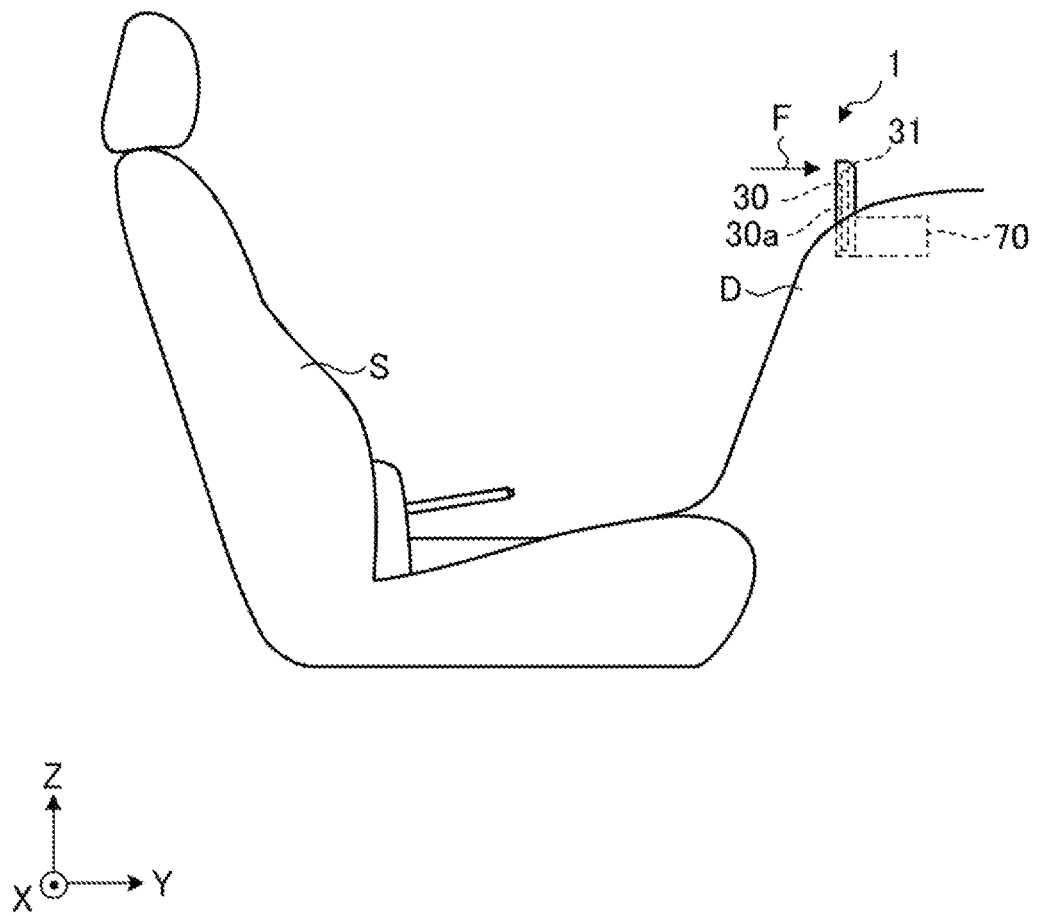
FIG. 1 illustrates an example of an installation place of a display apparatus according to an embodiment.
Figure 2:
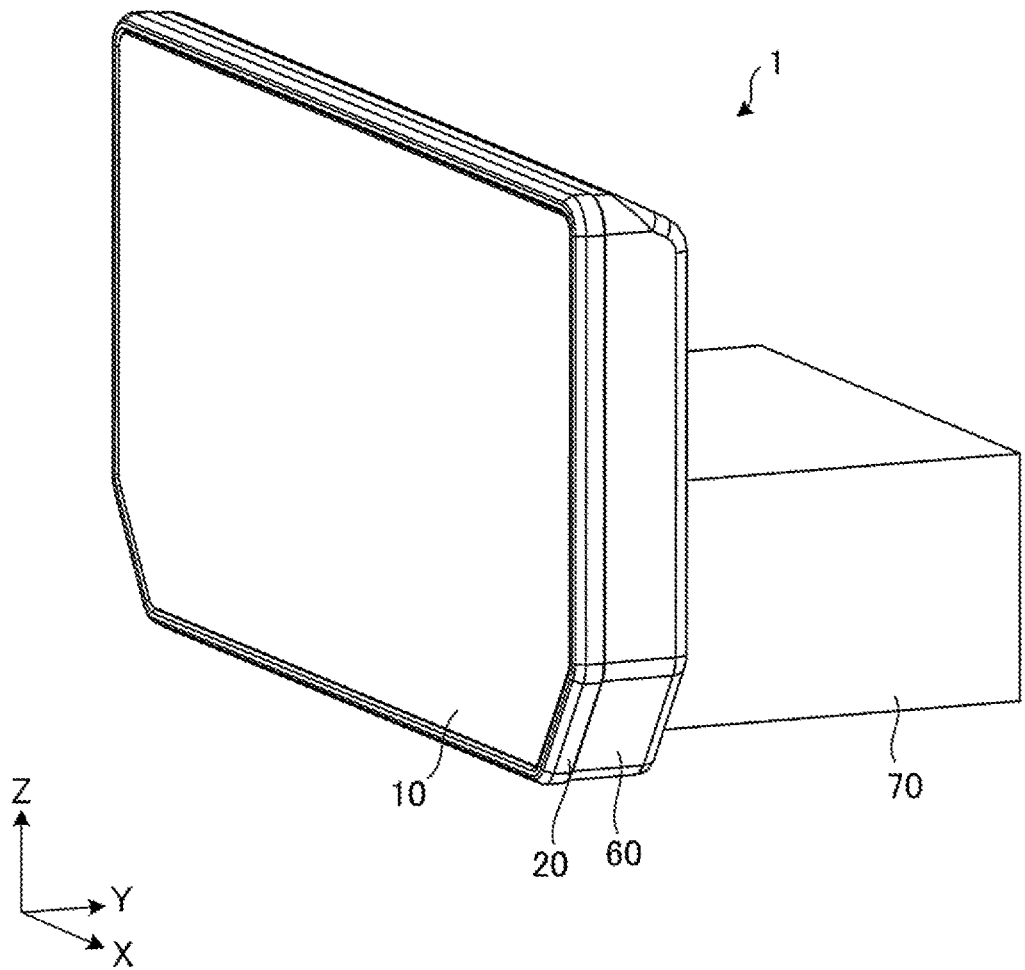
FIG. 2 is a perspective view of the display apparatus according to the embodiment.

FIG. 1 illustrates an example of an installation place of a display apparatus 1 according to an embodiment. FIG. 1 and FIG. 2 and the following figures described later are all schematic views. Furthermore, for convenience of illustration, FIG. 1, etc., show a three-dimensional orthogonal coordinate system defined by an X-axis direction, a Y-axis direction and a Z-axis direction that are orthogonal to each other. The three-dimensional orthogonal coordinate system may be shown in other drawings used for the following description. In the three-dimensional orthogonal coordinate system, the X-axis direction is a horizontal direction of a display apparatus 1 or a vehicle (width direction), the Y-axis direction is a front-back direction of the display apparatus 1 or the vehicle, and the Z-axis direction is a vertical direction. In the three-dimensional orthogonal coordinate system, the X-axis direction, the Y-axis direction and the Z-axis direction are directions in a state in which the display apparatus 1 is shown in the figures. An installation direction of the display apparatus 1, etc., are not limited thereto.

As illustrated in FIG. 1, the display apparatus 1 is installed in a dashboard D of a vehicle. Specifically, the display apparatus 1 includes a display panel 30, a body 70, and the like, and is configured to be mounted in the vehicle so that a part or whole of the display panel 30 is exposed from the display panel 30. More specifically, the display apparatus 1 is configured to be mounted in the vehicle so that an upper part 31 of the display panel 30 protrudes from the dashboard D. The body 70 is arranged in an interior of the dashboard D.

Various information, such as navigation information, is display on the display panel 30. A user (e.g., driver) who is seated in a seat S can view various information displayed on the display panel 30.

In the above, although an example in which the display apparatus 1 is mounted on the vehicle has been described, the invention is not limited thereto. That is, the display apparatus 1 may be, for example, a display apparatus of other electronic apparatus, such as a portable player that plays a DVD (Digital Versatile Disc), or a PC (Personal Computer)

By the way, in the display apparatus 1, a force may be applied to the display panel 30, and the like. For details, for example, an object, etc., collide with the display apparatus 1 and the force may be applied to a display surface 30a of the display panel 30 (refer to an arrow F). When such a force is applied to the display panel 30, the display apparatus 1 may be damaged.

Thus, when the force is applied to the display panel 30, the display apparatus 1 according to this embodiment is configured to secure an appropriate strength against the force. Furthermore, in this embodiment, by securing the appropriate strength in the display apparatus 1, the display apparatus 1 is suppressed from being damaged. As a result, it is possible to improve impact resistance of the display apparatus 1.

Figure 3:
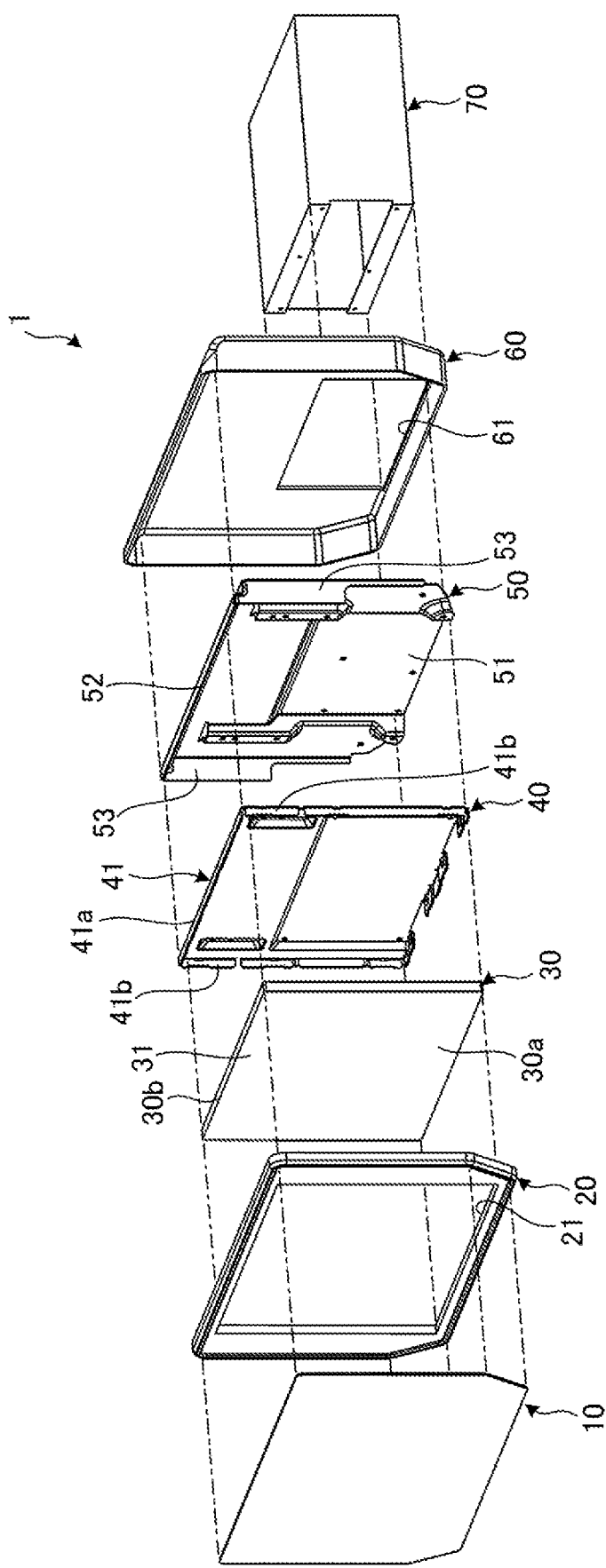
FIG. 3 is an exploded perspective view of the display apparatus.

This configuration will be described in detail with reference to FIG. 2 and the following figures. FIG. 2 is a perspective view of the display apparatus 1 according to the embodiment. FIG. 3 is an exploded perspective view of the display apparatus 1.

As illustrated in FIG. 2 and FIG. 3, the display apparatus 1 includes a cover glass 10, an outer frame 20, the display panel 30 (not shown in FIG. 2), a holder 40 (not shown in FIG. 2), a housing 50 (not shown in FIG. 2), a back-surface cover 60, and the body 70.

The cover glass 10 is a plate member manufactured from a material having translucency, such as a glass material. The cover glass 10 is arranged to cover the display surface 30*a* of the display panel 30 and protects the display surface 30*a*.

The outer frame 20 is arranged to surround an outer periphery of the cover glass 10 and holds the cover glass 10. Furthermore, the outer frame 20 is formed into a frame having an opening 21 so that the display surface 30*a* of the display panel 30 is exposed from the opening 21. The outer frame 20 is assembled to the back-surface cover 60. In an inner space formed by the outer frame 20 and the back-surface cover 60 that are assembled to each other, the display panel 30, the holder 40, and the housing 50 are arranged. The outer frame 30 is made of a resin.

The display panel 30 has the display surface 30*a* and displays various information described above. A liquid crystal panel is used as the display panel 30. However, the invention is not limited to this.

The display panel 30 has a rectangular shape in a front view, for example. The front view in this specification means a case in which the display surface 30*a* of the display panel 30 is viewed from a front face, in other words, viewed from a Y-axis negative direction side to a Y-axis positive direction side.

The holder 40 holds the display panel 30. Specifically, the holder 40 has a rectangular shape in the front view, for example. The holder 40 is arranged on a back side (Y-axis positive direction side) of the display panel 30, and holds the display panel 30 from the back side of the display panel 30. The holder 40 is made of a metal and manufactured of a sheet metal, etc. In this specification, the display panel 30 and the holder 40 that holds the display panel 30 may be collectively referred to as the "display panel 30".

The housing 50 houses the holder 40. Specifically, the housing 50 houses the holder 40 and the display panel 30 held by the holder 40. The housing 50 has a rectangular shape in the front view, for example. In other words, the housing 50 is a chassis whose surface on the Y-axis negative direction side is opened. The housing 50 is made of a metal and manufactured of a sheet metal, etc. A detailed configuration of the housing 50 will be described later.

The back-surface cover 60 is arranged on a back side of the housing 50 and assembled to the outer frame 20 as described above. The back-surface cover 60 has an opening 61. The body 70 is inserted into the opening 61 to be assembled. The back-surface cover 60 is made of a resin.

The body 70 is a case having an approximately rectangular parallelepiped shape and is communicably connected to the display panel 30, etc. In an interior of the body 70, various components that control the whole display apparatus 1, such as a CPU (Central Processing Unit, not shown), are housed.

Figure 4:
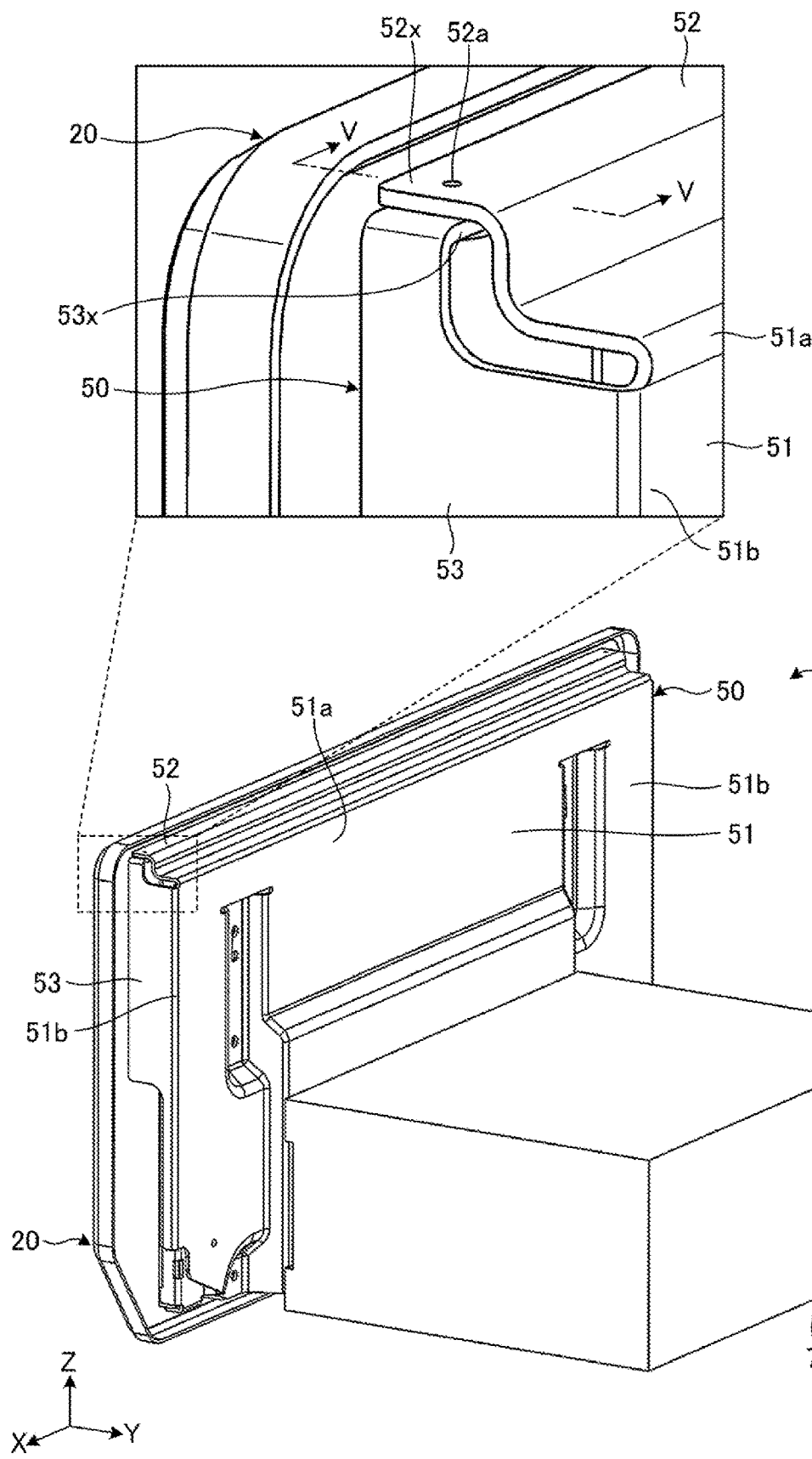
FIG. 4 is a perspective back view of the display apparatus.

Next, the configuration of the housing 50 described above will be also described in detail with reference to FIG. 4. FIG. 4 is a perspective back view of the display apparatus 1. For convenience of understanding, FIG. 4 shows the display apparatus 1 in a state in which the back-surface cover 60 is removed. FIG. 4 also shows an enlarged view enlarging a portion enclosed by dashed lines.

As illustrated in FIG. 3 and FIG. 4, the housing 50 includes a back surface 51, a first wall 52, and a second wall 53. The housing 50 houses a part of an outer periphery 30*b* of the display panel 30, in other words, a part of an outer periphery 41 of the holder 40 so as to surround the display panel 30 from the back side of the display panel 30.

Specifically, the back surface 51 is located adjacent to the back side of the display panel 30 (holder 40). The back surface 51 has a plate shape, for example, and has a rectangular shape in the front view.

The first wall 52 extends from a first side 51*a* of the back surface 51 (refer to FIG. 4, an upper side (upper end) of the back surface 51 here) toward a front side of the display panel 30 so as to surround a first part of the outer periphery 30*b* of the display panel 30 (i.e., a part of the outer periphery 41 of the holder 40 (an upper side (upper end) 41*a* of the holder 40 here)).

The second wall 53 extends from a second side 51*b* of the back surface 51 (refer to FIG. 4, right and left sides (right and left ends) of the back surface 51 here) toward the front side of the display panel 30 so as to surround a second part of the outer periphery 30*b* of the display panel 30 (i.e., a part of the outer periphery 41 of the holder 40 (right and left sides (right and left ends) 41*b* of the holder 40 here)). The second side 51*b* of the back surface 51 is adjacent to the first side 51*a* of the back surface 51.

Extending directions of the first side 51*a* and the second side 51*b* of the back surface 51 described above are orthogonal (approximately orthogonal) to each other. That is, the extending direction of the first side 51*a* of the back surface 51 is the X-axis direction and the extending direction of the second side 51*b* is the Z-axis direction, and the extending directions are orthogonal to each other. In the above, although an example in which the extending directions of the first side 51*a* and the second side 51*b* are orthogonal to each other has been described, this is merely an example and the invention is not limited thereto.

The first and second walls 52, 53, as described above, extend toward a side of the display panel 30 (Y-axis negative direction side). However, this also means that the first and second walls 52, 53 extend toward a side of a member to which the force is applied at a time of an impact.

The second wall 53, as illustrated in the enlarged view of FIG. 4, is formed so that an end 53*x* of the second wall 53 overlaps with an end 52*x* of the first wall 52. For example, the second wall 53 is formed so that the end 53*x* of the second wall 53 is positioned under the end 52*x* of the first wall 52 (Z-axis negative direction), and the end 53*x* of the second wall 53 overlaps with the end 52*x* of the first wall 52.

Figure 5:
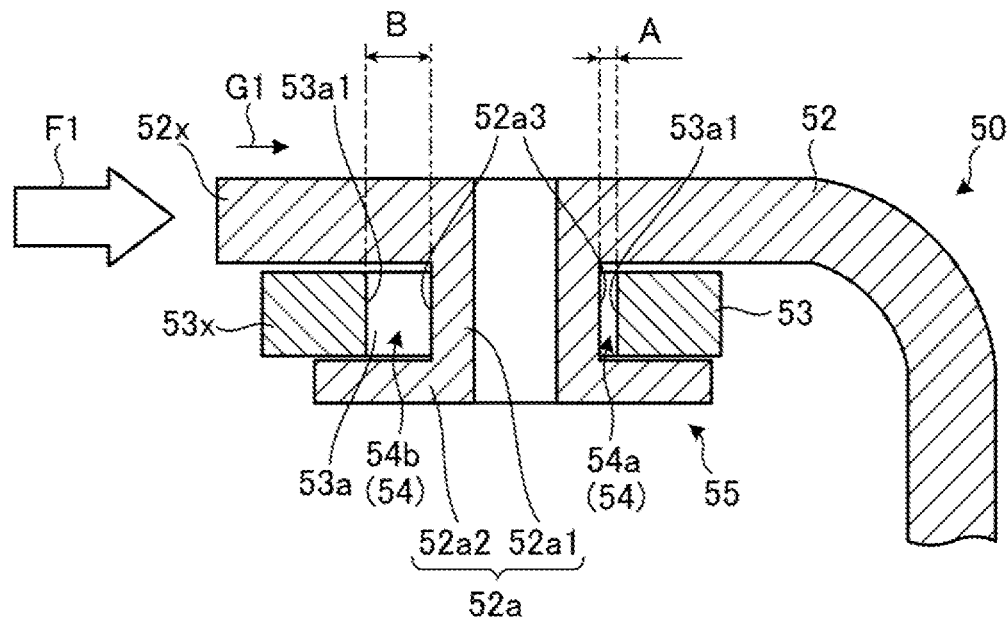
FIG. 5 is a cross-sectional view along a line V-V of FIG. 4.

By caulking the end 52*x* and the end 53*x* that overlap with each other, the first wall 52 is fastened to the second wall 53. The end 52*x* of the first wall 52 and the end 53*x* of the second wall 53 that are caulked with each other will be also described with reference to FIG. 5. FIG. 5 is a cross-sectional view along a line V-V of FIG. 4.

Here, "caulking" means that in a state in which a protrusion has been passed through a through hole, since a tip of the protrusion is pressed and deformed so as to be flatly crushed or radially opened, a first wall is fastened to a second wall.

As illustrated in FIG. 5, a protrusion 52a is formed on the first wall 52. On the other hand, a through hole 53a is formed in the second wall 53. The protrusion 52a passes through the through hole 53a. A tip of the protrusion 52a that has been passed through the through hole 53a is expanded to fasten the first wall 52 to the second wall 53. A portion in which the first wall 52 is fastened to the second wall 53 may be referred to as a "fastening portion 55".

Specifically, the protrusion 52a is formed on a portion of the end 52x of the first wall 52 that overlaps with the end 53x of the second wall 53. For more detail, the protrusion 52a is formed to protrude from the end 52x to a side of the end 53x of the second wall 53 (Z-axis negative direction).

More specifically, the protrusion 52a includes a cylindrical portion 52a1 and a caulking portion 52a2. The cylindrical portion 52a1 is formed in a hollow shape and extends from the end 52x to the side of the end 53x of the second wall 53. The cylindrical portion 52al is passed through the through hole 53a of the second wall 53.

The caulking portion 52a2 is formed in a lower end of the cylindrical portion 52a1. Since the end 53x of the second wall 53 is sandwiched between the caulking portion 52a2 and the end 52x of the first wall 52 and caulked, the first wall 52 is fastened to the second wall 53.

Forming of the protrusion 52a, passing the protrusion 52a through the through hole 53a, forming of the caulking portion 52a2, and the like, will be described later with reference to FIG. 6A to FIG. 6C.

Continuing with the explanation of FIG. 5, the through hole 53a is formed in a portion of the end 53x of the second wall 53 that overlaps with the end 52x of the first wall 52. Specifically, the through hole 53a is formed in a portion corresponding to the protrusion 52a of the first wall 52 at the end 53x of the second wall 53.

As described above, the protrusion 52a (exactly, the cylindrical portion 52al) is passed through the through hole 53a. In this way, since the protrusion 52a is passed through the through hole 53a, a diameter (hole diameter) of an inner circumferential surface 53al of the through hole 53a is larger than a diameter of an outer circumferential surface 52a3 of the protrusion 52a (exactly, the cylindrical portion 52al).

Therefore, a clearance 54 is formed between the outer circumferential surface 52a3 of the protrusion 52a that has been passed through the through hole 53a and the inner circumferential surface 53a1 of the through hole 53a.

In this embodiment, since the clearance 54 is properly set, when the force (refer to the arrow F in FIG. 1) is applied to the display panel 30, the appropriate strength against such a force is secured.

Specifically, since the force is applied to the display panel 30 and a force F1 is applied to the end 52x of the first wall 52, the first wall 52, as indicated by an arrow G1, is displaced toward in a direction opposite to the display panel 30 (Y-axis positive direction).

In this embodiment, a direction indicated by the arrow G1 may be referred to as a "displacement direction G1". A wall of the first wall 52 and the second wall 53 to which the force is applied from the side of the display panel 30 may be referred to as a "specific wall". In this embodiment, the first wall 52 is the "specific wall".

In this embodiment, the clearance 54 is divided into a first part and a second part. The first part which is adjacent to a side of the protrusion 52a that faces toward the back surface of the housing 50 is smaller than the second part which is adjacent to a side of the protrusion 52a that faces away from the back surface of the housing 50. Thus, when the force from the front side to the back side of the display panel 30 is applied to the first wall 52, the first wall 52 is suppressed from being displaced relative to the second wall 53. More specifically, in the clearance 54 described above, when the force F1 from the front side to the back side of the display panel 30 is applied to the first wall 52 as the specific wall, in the fastening portion 55 of the first wall 52 and the second wall 53, the first wall 52 starts to be displaced to the back side (Y-axis positive direction side) of the display panel relative to the second wall 53. Then, the first wall 52 is caulked and fastened to the second wall 53 in a state in which the clearance 54 is divided into the first part and the second part, and the first part (clearance 54a) which is adjacent to the side of the protrusion 52a that faces toward the back surface of the housing 50 (Y-axis positive direction side) is smaller than the second part (clearance 54b) which is adjacent to the side of the protrusion 52a that faces away from the back surface of the housing 50 (Y-axis negative direction side). Thus, this displacement is prevented.

Specifically, a distance A between the outer circumferential surface 52a3 of the protrusion 52a and the inner circumferential surface 53al of the through hole 53a in the clearance 54a is set to be shorter than a distance B between the outer circumferential surface 52a3 of the protrusion 52a and the inner circumferential surface 53al of the through hole 53a in the clearance 54b (A<B).

As a result, for example, even when the force is applied from the side of the display panel 30 to the first wall 52, and the first wall 52 starts to be displaced in the displacement direction G1, the protrusion 52a of the first wall 52 promptly abuts on the through hole 53a of the second wall 53 and functions as a stopper. Thus, it is possible to suppress displacement amount of the first wall 52 in the displacement direction G1, and secure the appropriate strength against the force from the side of the display panel 30.

The end 52x of the first wall 52 according to the embodiment may be formed to protrude to the side of the display panel 30 (refer to FIG. 3, the Y-axis negative direction side) compared to the end 53x of the second wall 53. That is, the end 52x of the first wall 52 protrudes farther toward the front side of the display panel 30 than the end 53x of the second wall 53. In such a configuration, when the force is applied to the display panel 30 (particularly, an edge of the display panel 30), since the first wall 52 receives more force, the displacement amount of the first wall 52 in the displacement direction G1 is suppressed, and the strength against the force from the side of the display panel 30 is more effectively secured.

Furthermore, in this embodiment, by securing the appropriate strength in the display apparatus 1, a breakage (in one example, cracking of the cover glass 10) of the display apparatus 1 is suppressed. As a result, it is possible to improve impact resistance of the display apparatus 1.

In the clearance 54, conversely, the clearance 54b that is formed opposite to the displacement direction G1 when the force is applied from the side of the display panel 30 to the first wall 52 as the specific wall and the first wall 52 is displaced is set to be larger than the clearance 54a that is formed on a side of the displacement direction G1.

As a result, for example, it is possible to set a value of the hole diameter of the through hole 53a through which the protrusion 52a of the first wall 52 can be easily passed, and thus, improve workability when passing the protrusion 52a of the first wall 52 through the through hole 53a.

The workability when passing the protrusion 52a through the through hole 53a, forming of the protrusion 52a, forming of the caulking portion 52a2, and the like, will be described with reference to FIG. 6A to FIG. 6C. FIG. 6A is a perspective view of the housing 50, specifically, a perspective view of the housing 50 before the first wall 52 and the second wall 53 are formed. FIG. 6B is a perspective view of the housing 50, specifically, after the second wall 53 has been formed and before the first wall 52 is formed. FIG. 6C shows a state in which the protrusion 52a of the first wall 52 is passed through the through hole 53a. FIG. 6C is a cross-sectional view similar to FIG. 5.

Figure 6A:
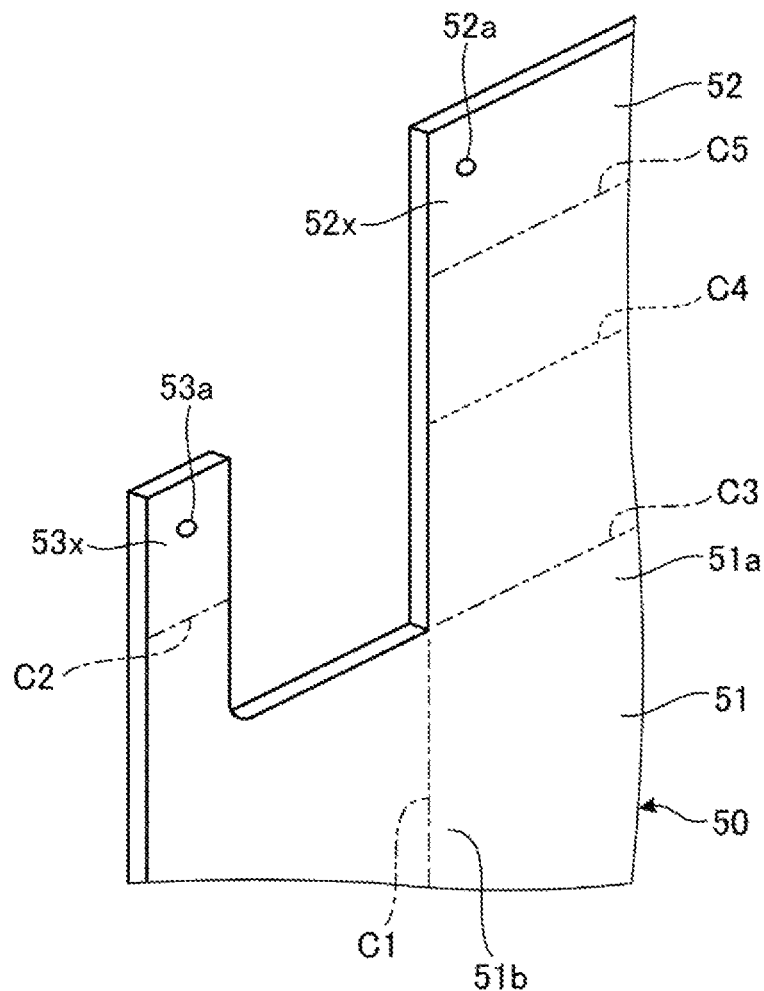
FIG. 6A is a first perspective view of a housing.
Figure 6B:
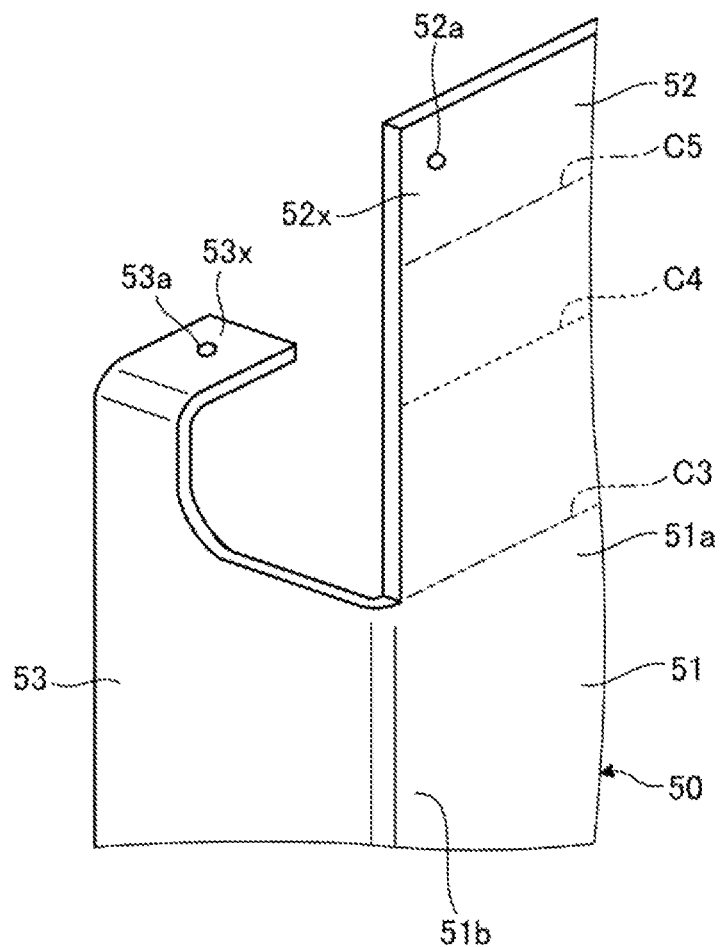
FIG. 6B is a second perspective view of the housing.

As illustrated in FIG. 6A, the housing 50 is manufactured of a plate member. Specifically, the first wall 52 is formed to extend in a Z-axis positive direction from the first side 51a of the back surface 51. The second wall 53 is formed to extend in an X-axis positive direction from the second side 51b of the back surface 51. Although illustration is omitted, the second wall 53 that is located opposite to the X-axis direction of the back surface 51 is formed to extend in an X-axis negative direction from the second side 51b of the back surface 51.

The protrusion 52a is formed on the end 52a of the first wall 52. At this time, while the protrusion 52a has the cylindrical portion 52a1, the protrusion 52a is not yet provided with the caulking portion 52a2 (refer to FIG. 6C).

The protrusion 52a is formed by applying a burring processing (a method of punching a hole in the plate member and forming a flange that has a cylindrical shape around the hole) to the end 52x of the first wall 52. As described above, in this embodiment, by using the burring processing, it is possible to easily form the protrusion 52a. The protrusion 52a may be formed by other processing other than the burring processing. For example, the protrusion 52a may be formed by press-fitting a cylindrical or bar-shaped member into a small hole opened in the end 52x of the first wall 52.

The through hole 53a is formed in the end 53x of the second wall 53. The first wall 52 and the second wall 53 are formed by bending the plate member.

In one example, the second wall 53 and the first wall 52 are sequentially formed by bending the plate member in this order. Specifically, the second wall 53 is formed by bending the second side 51b of the back surface 51. More specifically, the second wall 53 is formed as shown in FIG. 6B by bending the back surface 51 along mountain fold lines C1 and C2 shown in FIG. 6A.

Next, the first wall 52 is formed by bending the first side 51a of the back surface 51. Specifically, the first wall 52 (refer to FIG. 4) having a stepwise shape is formed by bending the back surface 51 along a mountain fold line C3, a valley fold line C4, and a mountain fold line C5 shown in FIG. 6B.

Passing the protrusion 52a through the through hole 53a when forming the first wall 52 will be described with reference to FIG. 6C. In FIG. 6A, the first wall 52 before passing the protrusion 52a through the through hole 53a is shown by a sold line, and the first wall 52 after having passed the protrusion 52a through the through hole 53a is shown by imaginary lines.

Figure 6C:
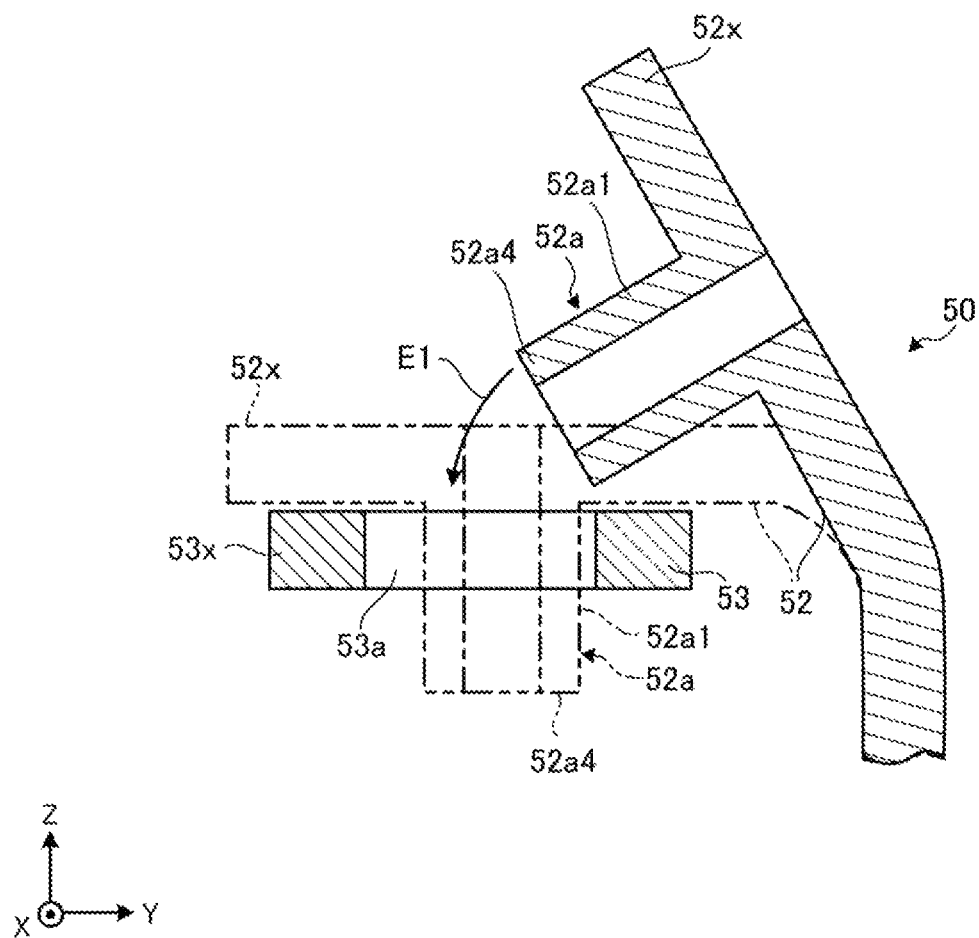
FIG. 6C shows a state in which a protrusion of a first wall is passed through a through hole.

As illustrated in FIG. 6C, in the first wall 52, the protrusion 52a is passed through the through hole 53a from a tip 52a4 of the protrusion 52a. (exactly, the cylindrical portion 52a1) in the bending processing (refer to an arrow E1).

In this way, in this embodiment, in the bending processing of the first wall 52, the protrusion 52a is passed through the through hole 53a. As described above, since the value of the hole diameter of the through hole 53a through which the protrusion 52a of the first wall 52 can be easily passed is set, it is possible to improve workability when passing the protrusion 52a of the first wall 52 through the through hole 53a.

Next, the tip 52a4 of the protrusion 52a (exactly, the cylindrical portion 52a1) is pressed, and the caulking portion 52a2 (refer to FIG. 5) is formed (in one example, a tip of a cylindrical protrusion formed by the burring processing is pushed and widened outward, and an eyelet caulking portion is formed). In this way, in this embodiment, the first wall 52 is fastened to the second wall 53 by caulking the end 52x and the end 53x that overlap with each other.

As described above, the display apparatus 1 according to the embodiment includes the display panel 30, and the housing 50 that houses at least a part of the outer periphery (e.g., the outer periphery 41 of the holder 40) of the display panel 30 so as to surround the display panel 30 from the back side of the display panel 30. The housing 50 includes the back surface 51, the first wall 52, the second wall 53, the protrusion 52a, and the through hole 53a. The back surface 51 is located adjacent to the back side of the display panel 30. The first wall 52 extends from the first side 51a of the back surface 51 toward the front side of the display panel 30 so as to surround the first part of the outer periphery of the display panel 30. The second wall 53 extends from the second side 51b of the back surface 51 toward the front side of the display panel 30 so as to surround the second part of the outer periphery of the display panel 30. The second side 51b of the back surface 51 is adjacent to the first side 51a of the back surface 51. The protrusion 52a is formed on the portion of the end 52x of the first wall 52 that overlaps with the end 53x of the second wall 53. The through hole 53a is formed in the end 53x of the second wall 53. The protrusion 52a passes through the through hole 53a.

The tip of the protrusion 52a that has been passed through the through hole 53a is expanded to fasten the first wall 52 to the second wall 53. Furthermore, the clearance 54 is formed between the outer circumferential surface 52a3 of the protrusion 52a that has been passed through the through hole 53a and the inner circumferential surface 53a1 of the through hole 53a. The clearance 54 is divided into the first part and the second part. The first part which is adjacent to the side of the protrusion 52a that faces toward the back surface of the housing 50 is smaller than the second part which is adjacent to the side of the protrusion 52a that faces away from the back surface of the housing 50. Thus, when the force from the front side to the back side of the display panel 30 is applied to the first wall 52, the first wall 52 is suppressed from being displaced relative to the second wall 53. As a result, when the force is applied to the display panel 30, the appropriate strength against such a force is secured.

In the above description, the protrusion 52a is formed on the end 52x of the first wall 52 and the through hole 53a is formed in the end 53a of the second wall 53. However, the invention is not limited thereto. For example, a through hole may be formed in the end 52x of the first wall 52 and a protrusion may be formed at the end 53x of the second wall 53.

The display panel 30 is configured to be mounted in the vehicle so that the upper part 31 of the display panel 30 protrudes from the dashboard D of the vehicle, and the first wall 52 as the specific wall is provided in a position corresponding to an upper side of the upper part 31 of the display panel 30.

Hands and body of the user as an occupant of the vehicle or luggage touch the upper part 31 of the display panel 30 that protrudes from the dashboard D so that the force is likely to be applied to the display panel 30 from the front side to the back side of the display panel 30. In this embodiment, when the force is applied to the upper part 31 of the display panel 30 that protrudes from the dashboard D, the appropriate strength against such a force is secured.

Figure 7:
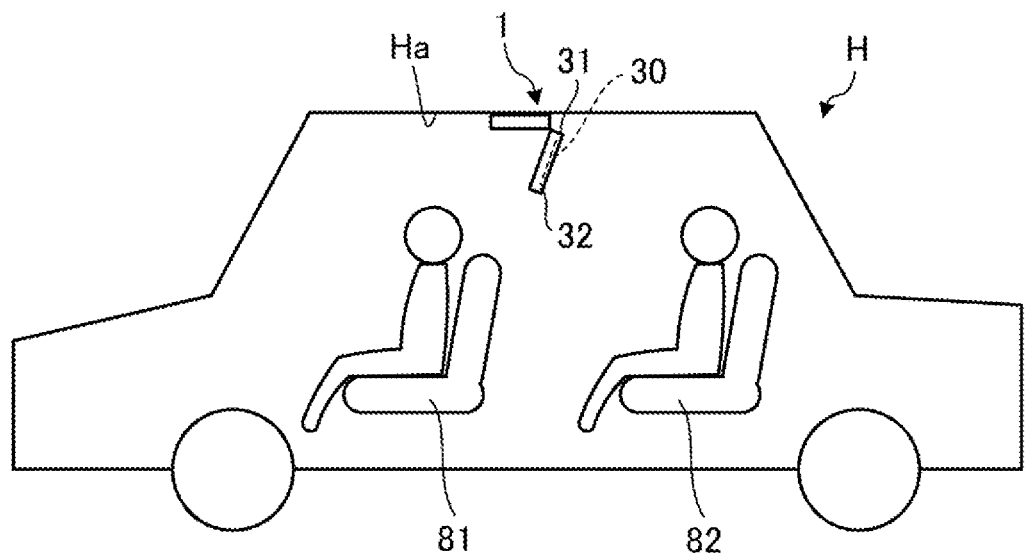
FIG. 7 is a schematic side view illustrating an example in which the display apparatus is suspended from a ceiling of a vehicle.

The force is like to be applied to sides other than the upper side of the upper part 31 of the display panel 30 depending on a method of arranging the display panel 30 into the vehicle. This will be described with reference to FIG. 7. FIG. 7 is a schematic side view illustrating an example in which the display apparatus 1 having the display panel 30 is suspended from a ceiling Ha of a vehicle H.

As illustrated in FIG. 7, the display panel 30 may be configured to be mounted in the vehicle H so that the upper part 31 of the display panel 30 is suspended from the ceiling Ha of the vehicle H. Specifically, for example, the display panel 30 may be configured to be mounted in the vehicle so as to be suspended from the ceiling Ha between a front seat 81 and a rear seat 82 of the vehicle H. In this case, hands and body of the user or luggage touch a lower side of a lower part 32 of the display panel 30 so that the force is likely to be applied to the lower part 32 of the display panel 30. In such a case, the first wall 52 as the specific wall may be provided in a position corresponding to the lower side of the lower part 32 of the display panel 30. In this way, the first wall 52 as the specific wall can be provided in a position corresponding to the side to which the force is likely to be applied depending on a method of arranging the display panel 30 into the vehicle H. As a result, the strength of the side to which the force is likely to be applied can be surely secured.

In this embodiment, in the configuration described above, the appropriate strength in the display apparatus 1 can be secured, for example, without using a new reinforcing member, such as arranging a new reinforcing member on the back of the display pane 30.

Modification

Figure 8:
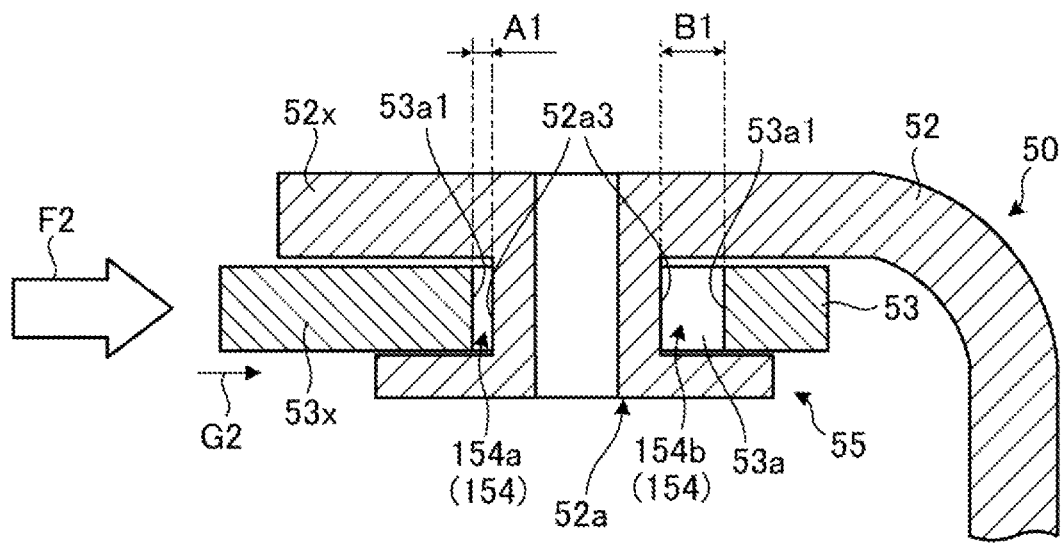
FIG. 8 illustrates a display apparatus according to a modification example.
Figure 8:
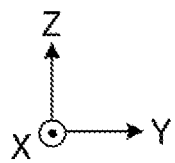

Next, a configuration of a display apparatus 1 according to a modification example will be described with reference to FIG. 8. FIG. 8 illustrates the display apparatus 1 according to the modification example and is a cross-sectional view similar to FIG. 5. In the configuration in common with the embodiment, the same elements are denoted with the same reference numerals, and redundant description is omitted.

As illustrated in FIG. 8, in the modification example, out of the first wall 52 and the second wall 53, the specific wall to which the force is applied from the display panel 30 is the second wall 53.

Specifically, since the force is applied to the display panel 30 and a force F2 is applied to the end 53x of the second wall 53, the second wall 53, as indicated by an arrow G2, starts to be displaced toward in a direction opposite to the display panel 30 (Y-axis positive direction). In the modification example, a direction indicated by the arrow G2 may be referred to as a "displacement direction G2".

In the modification example, since a clearance 154 that is formed between the outer circumferential surface 52a3 of the protrusion 52a passed through the through hole 53a and the inner circumferential surface 53a1 of the through hole 53a is properly set, when the force (refer to the arrow F in FIG. 1) is applied to the display panel 30, the appropriate strength against such a force is secured.

Specifically, the clearance 154 is divided into a first part and a second part. The first part which is adjacent to a side of the protrusion 52a that faces away from the back surface of housing 50 is smaller than the second part which is adjacent to a side of the protrusion 52a that faces toward the back surface of the housing 50. Thus, when the force from the front side to the back side of the display panel 30 is applied to the second wall 53, the second wall 53 is suppressed from being displaced relative to the first wall 52. More specifically, in the clearance 154, when the force F2 (force in the Y-axis positive direction) from the front side to the back side of the display panel 30 is applied to the second wall 53 as the specific wall, and in the fastening portion 55 of the first wall 52 and the second wall 53, the second wall 53 starts to be displaced to the back side (Y-axis positive direction side) of the display panel relative to the first wall 52, the first wall 52 is caulked and fastened to the second wall 53 in a state in which the clearance 154 is divided into the first part and the second part, the first part (clearance 154a) which is adjacent to the side of the protrusion 52a that faces away from the back surface of the housing 50 (Y-axis negative direction side) is smaller than the second part (clearance 154b) which is adjacent to the side of the protrusion 52a that faces toward the back surface of the housing 50 (Y-axis positive direction side). Thus, this displacement is prevented.

Specifically, a distance A1 between the outer circumferential surface 52a3 of the protrusion 52a and the inner circumferential surface 53a1 of the through hole 53a in the clearance 154a is set to be shorter than a distance B1 between the outer circumferential surface 52a3 of the protrusion 52a and the inner circumferential surface 53a1 of the through hole 53a in the clearance 154b (A1<B1).

As a result, for example, even when the force is applied from the side of the display panel 30 to the second wall 53, and the second wall 53 starts to be displaced in the displacement direction G2, the through hole 53a of the second wall 53 promptly abuts on the protrusion 52a of the first wall 52 and functions as a stopper. Thus, it is possible to suppress displacement amount of the second wall 53 in the displacement direction G2, and secure the appropriate strength against the force from the side of the display panel 30. Also in the modification example, similar to the embodiment, the display apparatus 1 is suppressed from being damaged. As a result, it is possible to improve impact resistance of the display apparatus 1.

The end 53x of the second wall 53 according to the modification example may be formed to protrude to the side of the display panel 30 (refer to FIG. 8, the Y-axis negative direction side) compared to the end 52x of the first wall 52. That is, the end 53x of the second wall 53 protrudes farther toward the front side of the display panel 30 than the end 52x of the first wall 52. In such a configuration, when the force is applied to the display panel 30 (particularly, an edge of the display panel 30), since the second wall 53 receives more force, the displacement amount of the second wall 53 in the displacement direction G2 is suppressed, and the strength against the force from the side of the display panel 30 is more effectively secured.

In the clearance 154 according to the modification example, conversely, the clearance 154b that is formed opposite to the displacement direction G2 when the force is applied from the side of the display panel 30 to the second wall 53 as the specific wall and the second wall 53 is displaced is set to be larger than the clearance 154a that is formed on a side of the displacement direction G2.

As a result, in the modification example, similar to the embodiment, for example, it is possible to set a value of the hole diameter of the through hole 53a through which the protrusion 52a of the first wall 52 can be easily passed, and thus, improve workability when passing the protrusion 52a of the first wall 52 through the through hole 53a.

Also in the modification example, the display panel 30 may be configured to be mounted in the vehicle so that the upper part 31 of the display panel 30 protrudes from the dashboard D (refer to FIG. 1) of the vehicle, and the second wall 53 as the specific wall may be provided in a position corresponding to the upper side of the upper part 31 of the display panel 30. The display panel 30 may be configured to be mounted in the vehicle to be suspended from the ceiling Ha (refer to FIG. 7) of the vehicle H, and the second wall 53 as the specific wall may be provided in a position corresponding to the lower side of the lower part 32 of the display panel 30. Furthermore, the first wall 53 as the specific wall can be provided in a position corresponding to the side to which the force is likely to be applied depending on a method of arranging the display panel 30 into the vehicle. As a result, the strength of the side to which the force is likely to be applied can be surely secured.

As described above, the display apparatus 1 according to the modification example includes the display panel 30, and the housing 50 that houses at least a part of the outer periphery of the display panel 30 (e.g., the outer periphery 41 of the holder 40) so as to surround the display panel 30 from the back side of the display panel 30. The housing 50 includes the back surface 51, the first wall 52, the second wall 53, the protrusion 52a, and the through hole 53a. The back surface 51 is located adjacent to the back side of the display panel 30. The first wall 52 extends from the first side 51a of the back surface 51 toward the front side of the display panel 30 so as to surround the first part of the outer periphery of the display panel 30. The second wall 53 extends from the second side 51b of the back surface 51 toward the front side of the display panel 30 so as to surround the second part of the outer periphery of the display panel 30. The second side 51b of the back surface 51 is adjacent to the first side 51a of the back surface 51. The protrusion 52a is formed on the portion of the end 52x of the first wall 52 that overlaps with the end 53x of the second wall 53. The through hole 53a is formed in the end 53x of the second wall 53. The protrusion 52a passes through the through hole 53a.

The tip of the protrusion 52a that has been passed through the through hole 53a is expanded to fasten the first wall 52 to the second wall 53. Furthermore, the clearance 154 is formed between the outer circumferential surface 52a3 of the protrusion 52a that has been passed through the through hole 53a and the inner circumferential surface 53a1 of the through hole 53a. The clearance 154 is divided into the first part and the second part, the first part which is adjacent to the protrusion 52a that faces away from the back surface of the housing 50 is smaller than the second part which is adjacent to the side of the protrusion 52a that faces toward the back surface of the housing 50. Thus, when the force from the front side to the back side of the display panel 30 is applied to the second wall 53, the second wall 53 is suppressed from being displaced relative to the first wall 52. As a result, when the force is applied to the display panel 30, the appropriate strength against such a force is secured.

In the above embodiment and modification example, an example in which the housing 50 surrounds a part of the outer periphery 41 of the holder 40 has been described. However, the invention is not limited thereto. The housing 50 may surround the whole of the outer periphery 41 of the holder 40. That is, the housing 50 may house at least a part of the outer periphery 41 of the holder 40 so as to surround the holder 40.

It is possible for a person skilled in the art to easily come up with more effects and modifications. Thus, a broader modification of this invention is not limited to specific description and typical embodiments described and expressed above. Therefore, various modifications are possible without departing from the general spirit and scope of the invention defined by claims attached and equivalents thereof.

While the invention has been shown and described in detail, the foregoing description is in all aspects illustrative and not restrictive. It is therefore understood that numerous other modifications and variations can be devised without departing from the scope of the invention.

What is claimed is:
1. A display apparatus comprising:
a display panel; and
a housing that houses at least a part of an outer periphery of the display panel so as to surround the display panel from a back side of the display panel, the housing including:
a back surface that is located adjacent to the back side of the display panel;
a first wall that extends from a first side of the back surface toward a front side of the display panel so as to surround a first part of the outer periphery of the display panel;
a second wall that extends from a second side of the back surface toward the front side of the display panel so as to surround a second part of the outer periphery of the display panel, the second side of the back surface being adjacent to the first side of the back surface;
a protrusion that is formed on a portion of an end of the first wall that overlaps with an end of the second wall; and
a through hole that is formed in the end of the second wall, the protrusion passing through the through hole, wherein
a tip of the protrusion that has been passed through the through hole is expanded to fasten the first wall to the second wall, and
a clearance that is formed between an outer circumferential surface of the protrusion and an inner circumferential surface of the through hole is divided into a first part and a second part, the first part which is adjacent to a side of the protrusion that faces toward the back surface of the housing is smaller than the second part which is adjacent to a side of the protrusion that faces away from the back surface of the housing so that when a force from the front side to the back side of the display panel is applied to the first wall, the first wall is suppressed from being displaced relative to the second wall.

2. The display apparatus according to claim 1, wherein the display panel is configured to be mounted in a vehicle so that an upper part of the display panel protrudes from a dashboard of the vehicle.

3. The display apparatus according to claim 1, wherein the display panel is configured to be mounted in a vehicle so that an upper part of the display panel protrudes from a dashboard of the vehicle, and the first wall is provided in a position corresponding to an upper side of the upper part of the display panel.

4. The display apparatus according to claim 1, wherein the display panel is configured to be mounted in a vehicle so that an upper part of the display panel is suspended from a ceiling of the vehicle.

5. The display apparatus according to claim 1, wherein the display panel is configured to be mounted in a vehicle so that an upper part of the display panel is suspended from a ceiling of the vehicle, and the first wall is provided in a position corresponding to a lower side of a lower part of the display panel.

6. The display apparatus according to claim 1, wherein the end of the first wall protrudes farther toward the front side of the display panel than the end of the second wall.

7. A display apparatus comprising:
a display panel; and
a housing that houses at least a part of an outer periphery of the display panel so as to surround the display panel from a back side of the display panel, the housing including:
a back surface that is located adjacent to the back side of the display panel;
a first wall that extends from a first side of the back surface toward a front side of the display panel so as to surround a first part of the outer periphery of the display panel;
a second wall that extends from a second side of the back surface toward the front side of the display panel so as to surround a second part of the outer periphery of the display panel, the second side of the back surface being adjacent to the first side of the back surface;
a protrusion that is formed on a portion of an end of the first wall that overlaps with an end of the second wall; and
a through hole that is formed in the end of the second wall, the protrusion passing through the through hole, wherein a tip of the protrusion that has been passed through the through hole is expanded to fasten the first wall to the second wall, and
a clearance that is formed between an outer circumferential surface of the protrusion and an inner circumferential surface of the through hole is divided into a first part and a second part, the first part which is adjacent to a side of the protrusion that faces away from the back surface of the housing is smaller than the second part which is adjacent to a side of the protrusion that faces toward the back surface of the housing so that when a force from the front side to the back side of the display panel is applied to the second wall, the second wall is suppressed from being displaced relative to the first wall.

8. The display apparatus according to claim 7, wherein the display panel is configured to be mounted in a vehicle so that an upper part of the display panel protrudes from a dashboard of the vehicle.

9. The display apparatus according to claim 7, wherein the display panel is configured to be mounted in a vehicle so that an upper part of the display panel protrudes from a dashboard of the vehicle, and the second wall is provided in a position corresponding to an upper side of the upper part of the display panel.

10. The display apparatus according to claim 7, wherein the display panel is configured to be mounted in a vehicle so that an upper part of the display panel is suspended from a ceiling of the vehicle.

11. The display apparatus according to claim 7, wherein the display panel is configured to be mounted in a vehicle so that an upper part of the display panel is suspended from a ceiling of the vehicle, and the second wall is provided in a position corresponding to a lower side of a lower part of the display panel.

12. The display apparatus according to claim 7, wherein the end of the second wall protrudes farther toward the front side of the display panel than the end of the first wall.

* * * * *